(12) United States Patent
Carollo et al.

(10) Patent No.: US 9,111,773 B2
(45) Date of Patent: Aug. 18, 2015

(54) FORMING THREE DIMENSIONAL ISOLATION STRUCTURES

(71) Applicant: Micron Technology, Inc., Boise, ID (US)

(72) Inventors: Enzo Carollo, Montecchio Prec. (IT); Marcello Mariani, Milan (IT); Sara Marelli, Cantu (IT); Luca Di Piazza, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/567,837

(22) Filed: Dec. 11, 2014

(65) Prior Publication Data

US 2015/0091128 A1    Apr. 2, 2015

Related U.S. Application Data

(62) Division of application No. 12/952,240, filed on Nov. 23, 2010, now Pat. No. 8,932,935.

(51) Int. Cl.
*H01L 29/66* (2006.01)
*H01L 29/06* (2006.01)

(52) U.S. Cl.
CPC .................... *H01L 29/0649* (2013.01)

(58) Field of Classification Search
CPC .................................. H01L 21/76224
See application file for complete search history.

(56) References Cited

U.S. PATENT DOCUMENTS

| | | | |
|---|---|---|---|
| 8,932,935 B2 * | 1/2015 | Carollo et al. | ............ 438/424 |
| 2006/0246684 A1 | 11/2006 | Hoshi et al. | |
| 2008/0213970 A1 | 9/2008 | Piccolo et al. | |
| 2008/0305611 A1 | 12/2008 | Hirota | |

* cited by examiner

*Primary Examiner* — Seahvosh Nikmanesh
(74) *Attorney, Agent, or Firm* — Dorsey & Whitney LLP

(57) ABSTRACT

A three dimensional shallow trench isolation structure including sets of parallel trenches extending in two perpendicular directions may be formed by depositing a conformal deposition in a first set of parallel trenches, oxidizing the second set of trenches to enable selective deposition in said second set of trenches and then conformally depositing in said second set of trenches. In some embodiments, only one wet anneal, one etch back, and one high density plasma chemical vapor deposition step may be used to fill both sets of trenches.

20 Claims, 7 Drawing Sheets

FORMING THREE DIMENSIONAL ISOLATION STRUCTURES

CROSS-REFERENCE TO RELATED APPLICATION(S)

This application is a divisional of U.S. patent application Ser. No. 12/952,240 filed Nov. 23, 2010, issued as U.S. Pat. No. 8,932,935, on Jan. 13, 2015, the disclosure of which is hereby incorporated in its entirety herein by reference.

SUMMARY OF THE INVENTION

This relates to semiconductor fabrication processes.

A three dimensional isolation structure is an isolated semiconductor structure with trenches in two perpendicular directions. This structure results in the formation of a regular array of trench isolated pillars. The shape of the pillars is a function of the spacing between the trenches formed in each of the two perpendicular directions.

In most trench filling operations using a conformal deposit, a seam is formed in the deposit. The seam or void is centrally located in the deposit. This void will then be exposed to subsequent wet etches and cleanings, which can result in damage. Moreover, the conformal film is generally annealed. A wet anneal may be used to close seams and a dry anneal at a higher temperature may be used to decrease the wet etch rate of the film. Thus, the thermal budget may be increased due to the presence of the seams.

DETAILED DESCRIPTION OF PREFERRED EMBODIMENTS

In accordance with some embodiments, a three dimensional isolation structure may be formed in which some of the steps used to form the isolation in one direction are not used in connection with forming the isolation in the other direction.

Figure 1:
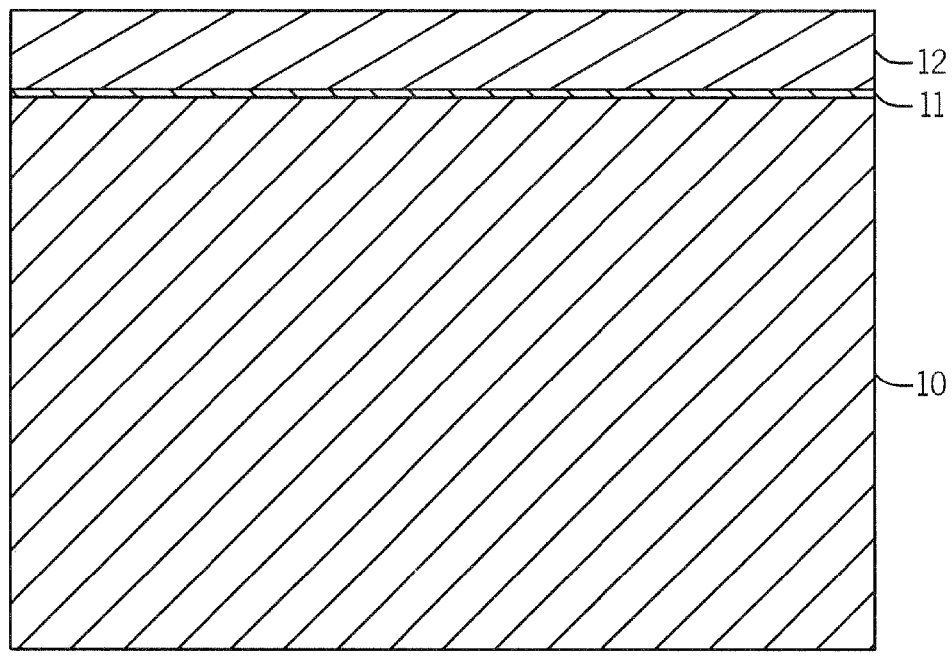
FIG. 1 is a side elevational view at the inception of the process in a second direction.
Figure 2:
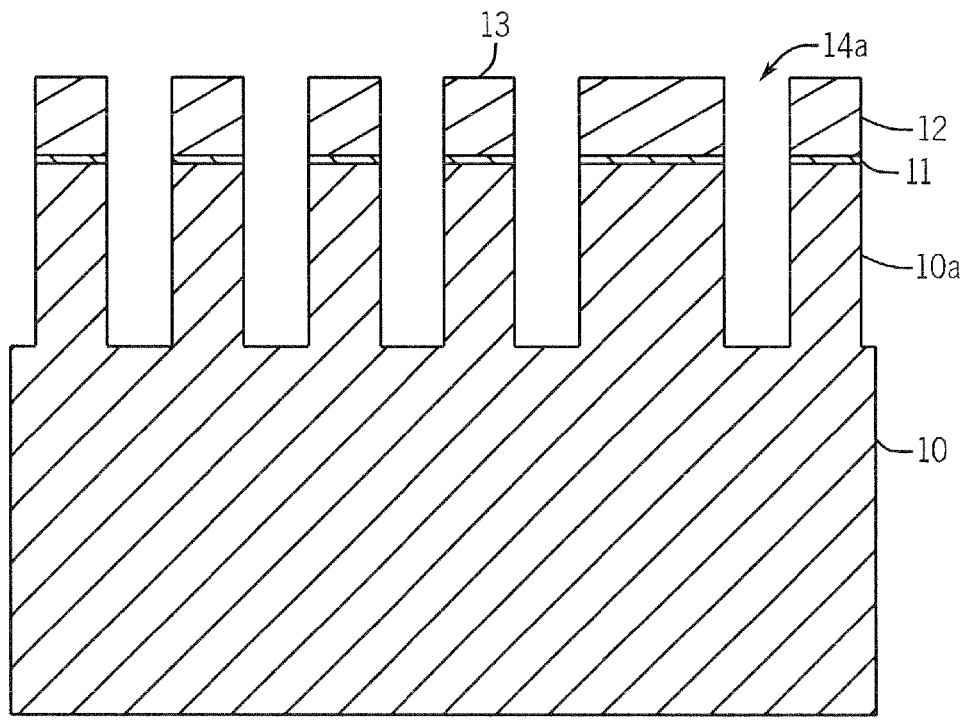
FIG. 2 is a side elevational view at the same time as FIG. 1 in a first direction perpendicular to said second direction in accordance with one embodiment.

Referring to FIG. 1, showing a semiconductor structure in accordance with one embodiment in a second direction, a silicon nitride layer 12 may be formed over a silicon substrate 10 in one embodiment. A pad oxide 11 may be formed between the layer 12 and the substrate 10. At the same time, as shown in FIG. 2, in the first direction (perpendicular to the second direction, shown in FIG. 1), a series of parallel, mostly regularly spaced trenches 14a may be formed through the nitride layer 12 and partially through the upper portion 10a of the silicon substrate 10.

Active area pillars 13 between trenches may then be made up of nitride over a pad oxide over silicon in some embodiments.

Figure 3:
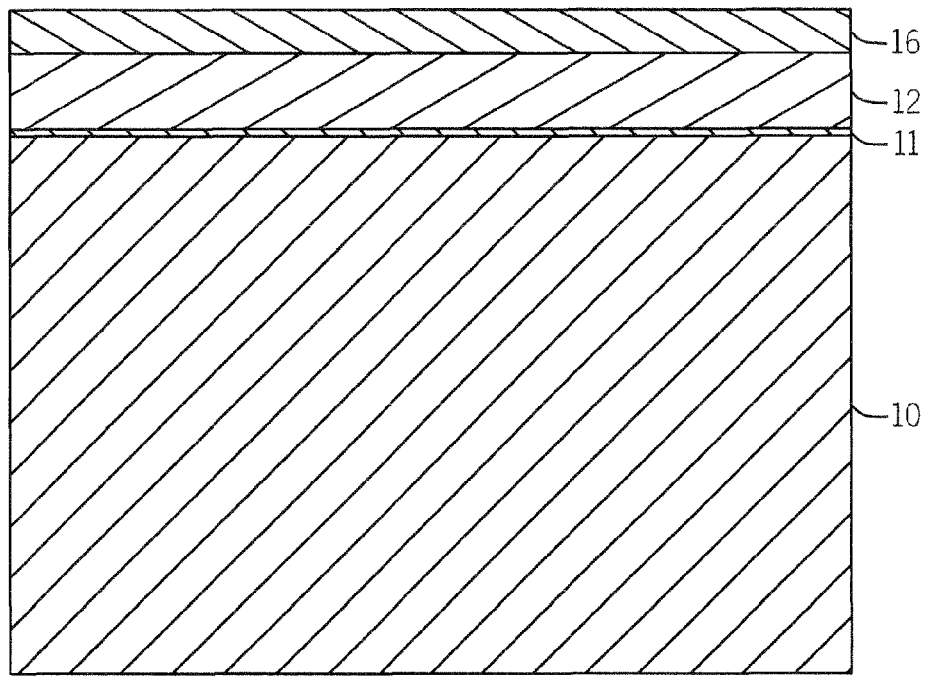
FIG. 3 is a side elevational view in the second direction at a stage subsequent to the stage shown in FIG. 1.
Figure 4:
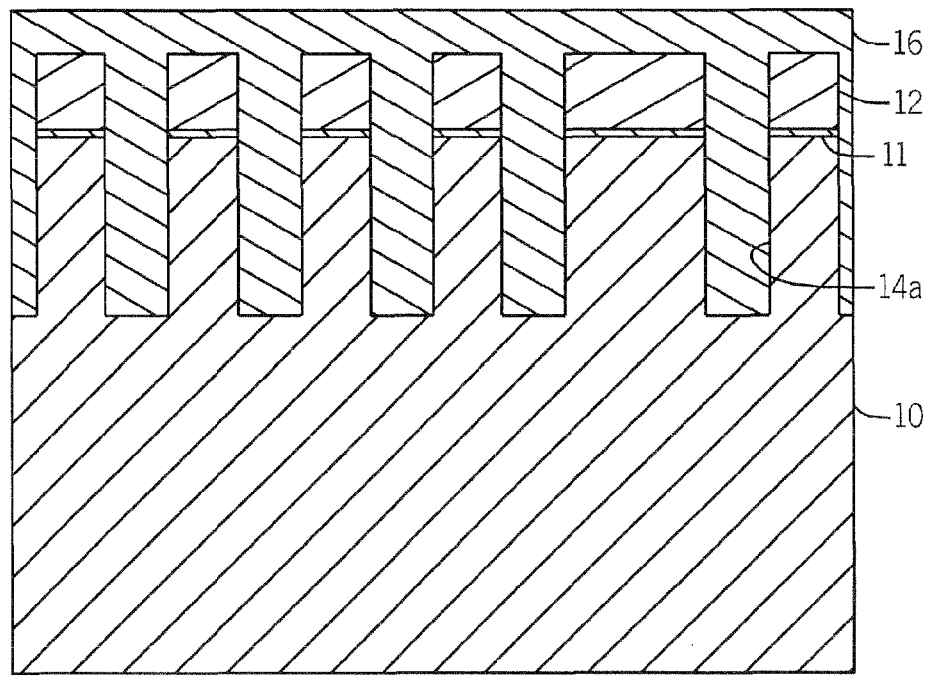
FIG. 4 is a side elevational view in the first direction at the same stage shown in FIG. 3 in accordance with one embodiment.

Then, trench filling is done in the first direction, creating a layer 16 in the second direction, as shown in FIG. 3, and filling the trenches 14a in the first direction as shown in FIG. 4. The trench filling may be a combination of a sidewall deposition, followed by conformal film deposition for first direction filling. No anneal or only dry anneal may be used in some embodiments. "Sidewall deposition" involves forming a thin liner by oxidizing the substrate. "Conformal deposition" involves depositing, in a trench, a layer that has substantially uniform deposition thickness on the walls and bottom of the trench, as well as on the surface that the trench is formed in. Sidewall deposition may be the same in both the first and second direction trenches of a three dimensional isolation structure, in some embodiments.

Figure 5:
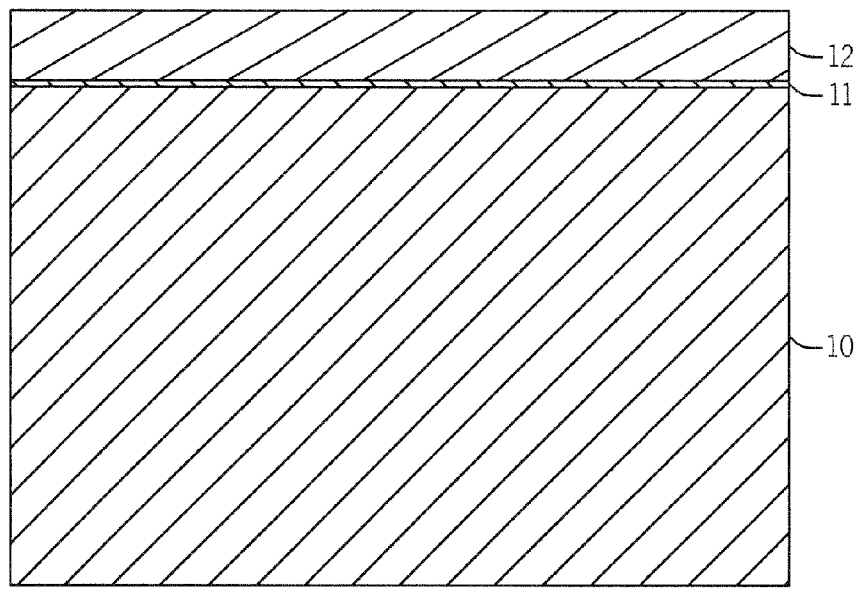
FIG. 5 is a side elevational view at a stage subsequent to that shown in FIG. 3 in accordance with one embodiment.
Figure 6:
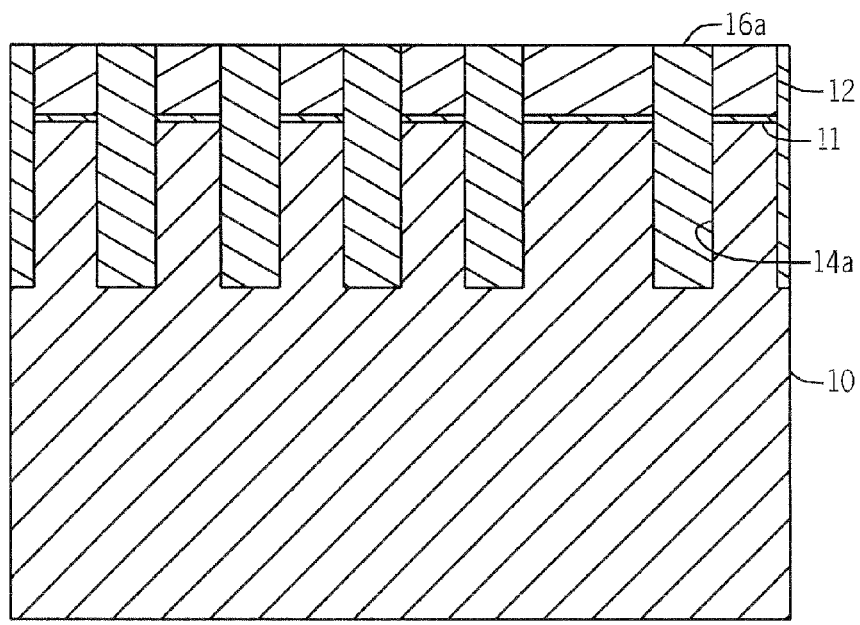
FIG. 6 is a side elevational view in the first direction at the same stage shown in FIG. 5 in accordance with one embodiment.

A thick oxide deposition (not shown) may be used to fill the large areas, followed by planarization, as shown in FIGS. 5 and 6. The planarization is done down to the upper surface of the nitride layer 12 in one embodiment. As a result, the trenches 14a are filled with the trench filler 16a.

Figure 7:
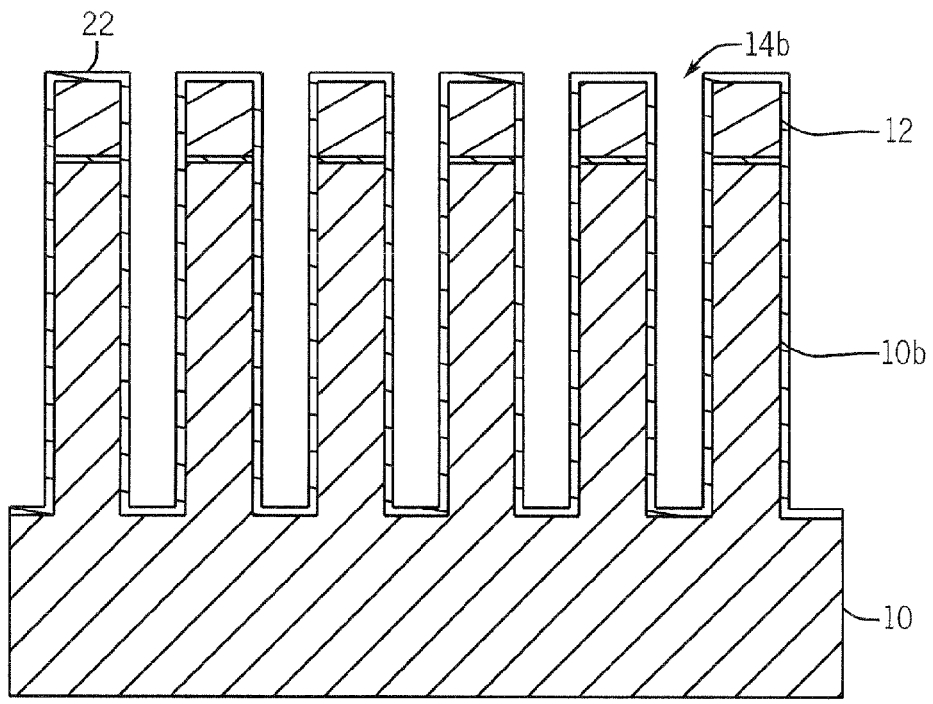
FIG. 7 is a side elevational view at a stage subsequent to that shown in FIG. 5 in accordance with one embodiment.

Thereafter, the trenches 14b are formed and filled in the second direction, as shown in FIGS. 7-14, with the odd numbered figures showing the second direction and the even numbered figures showing the first direction. In one embodiment, the trenches 14b in the second direction are deeper than the trenches 14a in the first direction, as shown in FIG. 7.

Figure 8:
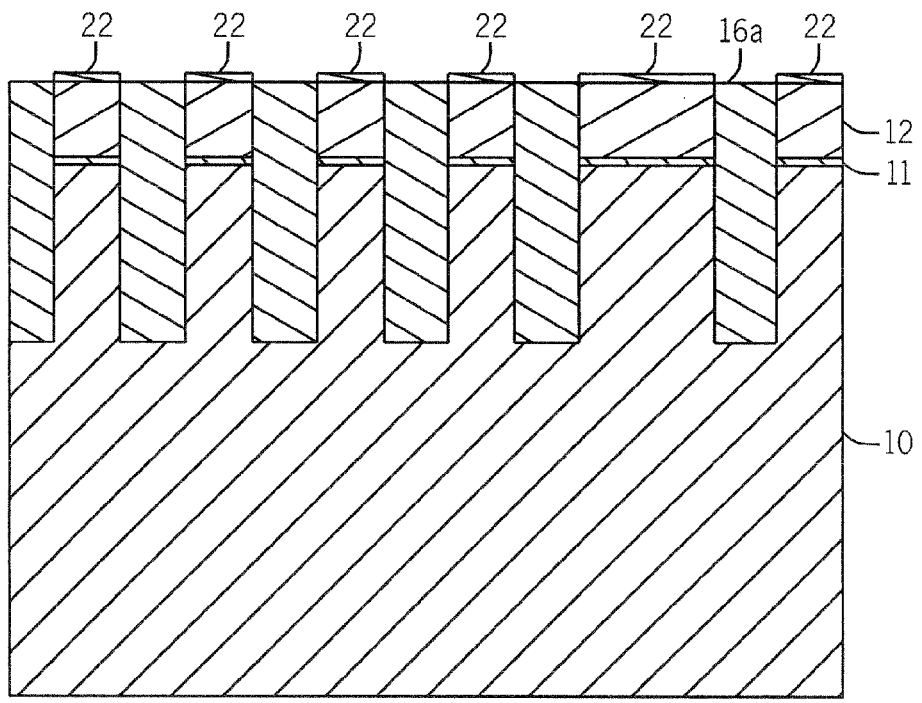
FIG. 8 is a side elevational view in the first direction of the same stage shown in FIG. 7.

In the second direction, the trenches 14b are first treated to encourage ensuing preferential deposition in the trenches 14b instead of on the existing filler 16a. For example, the treatment may involve covering the surfaces that will preferentially receive the deposition with an appropriate oxidation 22. The oxidation forms preferentially on the silicon nitride layer 12 and the silicon substrate 10, as shown in FIGS. 7 and 8. The oxidation 22 does not form on the first direction trench filler 16a (FIG. 8) in one embodiment. As a result of this oxidation 22 and the nature of the ensuing conformal deposition, the ensuing conformal deposition occurs preferentially in the second trenches 14b. In one embodiment, the oxidation 22 may be formed by in-situ steam generation (ISSG), which is a steam process that oxidizes active area silicon and nitride, but leaves unchanged the field oxide in the first direction fill. In this manner, a different surface is exposed to the second conformal deposition so that the growth rate is significantly lower than the growth rate where the oxidation is not present.

Figure 9:
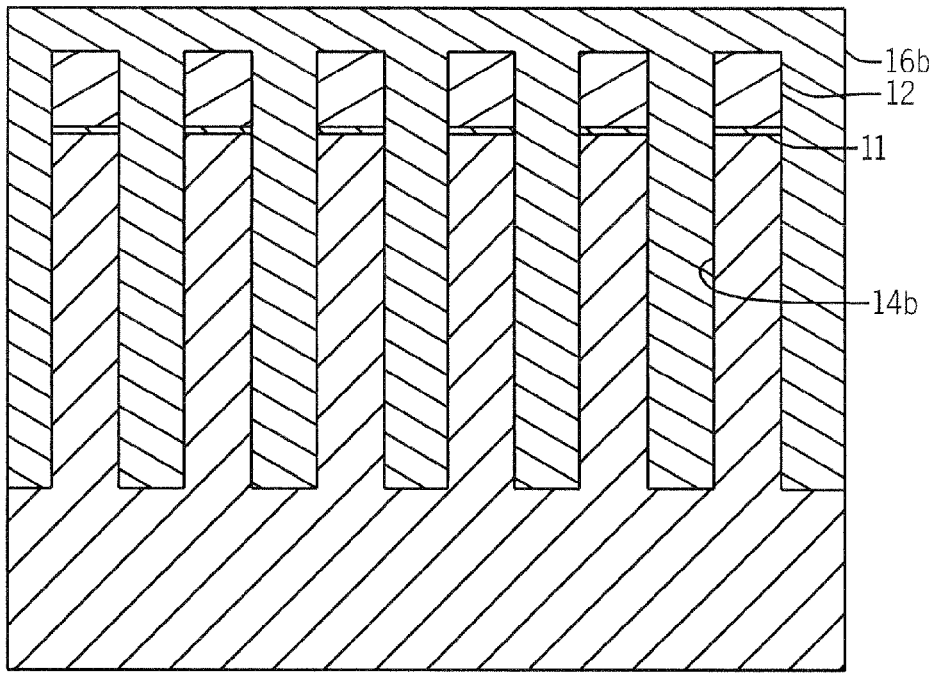
FIG. 9 is a side elevational view at a stage subsequent to that shown in FIG. 7 in accordance with one embodiment.
Figure 10:
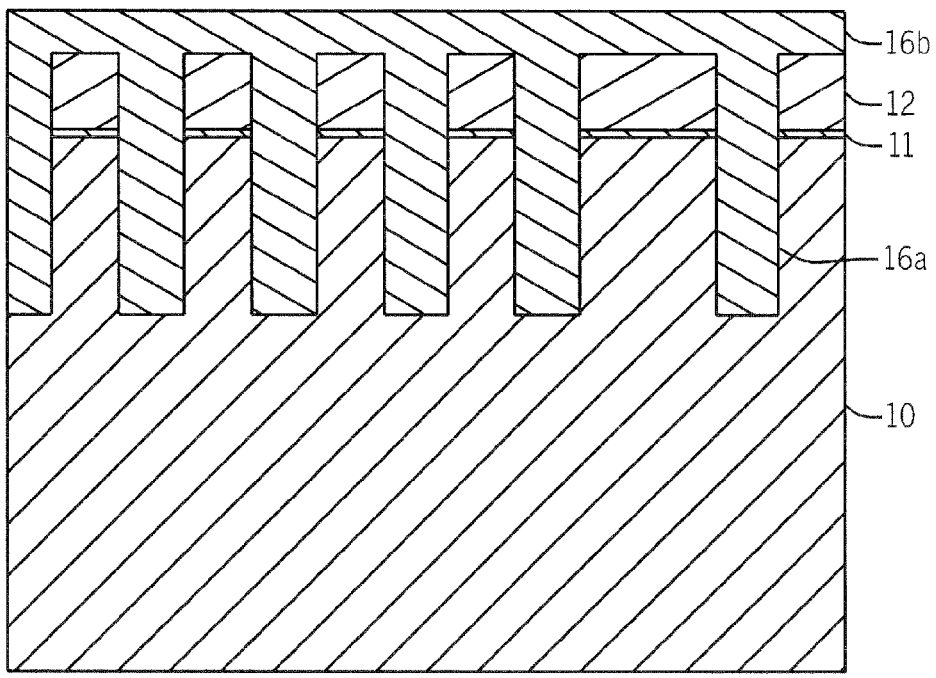
FIG. 10 is a side elevational view in the first direction at the same stage shown in FIG. 9 in accordance with one embodiment.

Then, referring to FIG. 9, a sidewall deposition is followed by conformal film deposition, to fill the trenches 14b, in the second direction, with trench filler 16b. Then a wet and dry anneal is done, followed by a dry or wet etch back.

Figure 11:
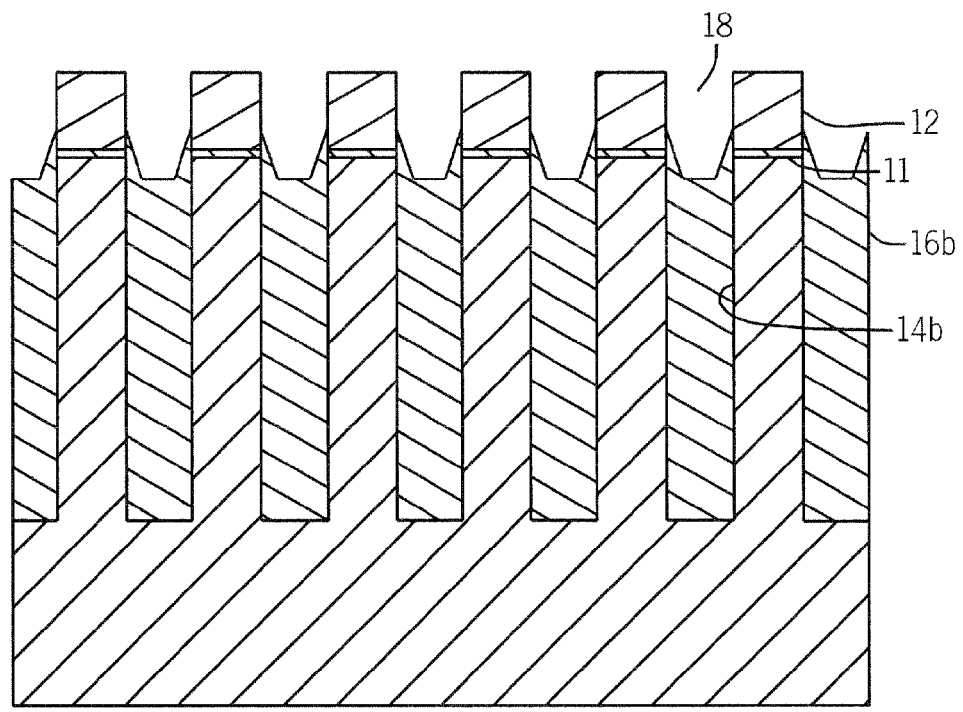
FIG. 11 is a side elevational view at a stage subsequent to that shown in FIG. 9.
Figure 12:
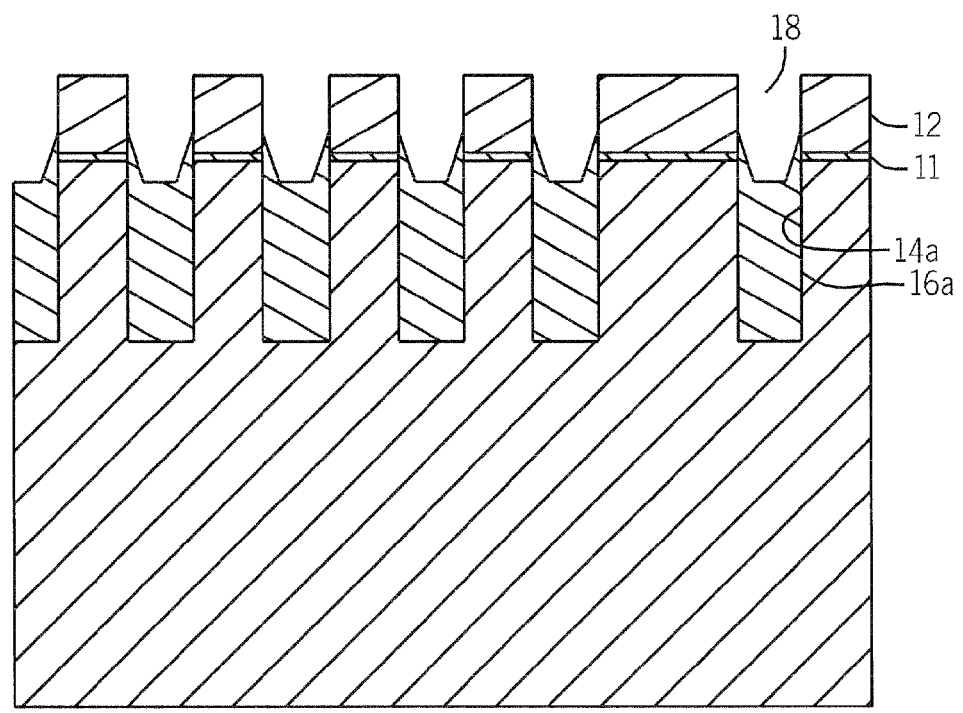
FIG. 12 is a side elevational view in the first direction of the same stage shown in FIG. 11 in accordance with one embodiment.

As shown in FIGS. 11 and 12, the etch back results in trenches 18, within the previously filled trenches 14a and 14b, in both the second and first directions. The trenches 18 may have a wider upper end and a tapered lower end as a result of the nature of the etch back. The etch back may occur through the trench fillers 16a and 16b between the islands of the nitride layer 12 and partially penetrating within the depth of the silicon substrate 10. The target trench 18 depth may be determined so as to avoid any ensuing wet process on the conformal film, instead relying only on high-density plasma chemical vapor deposition (HDPCVD) in one embodiment.

Figure 13:
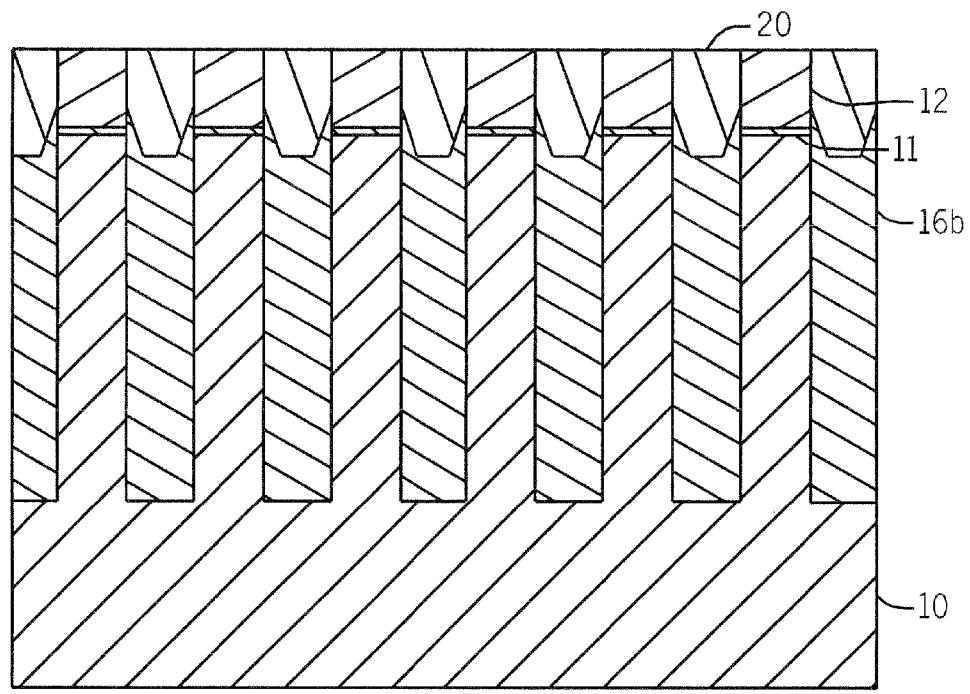
FIG. 13 is a side elevational view at a stage subsequent to that shown in FIG. 11 in accordance with one embodiment.
Figure 14:
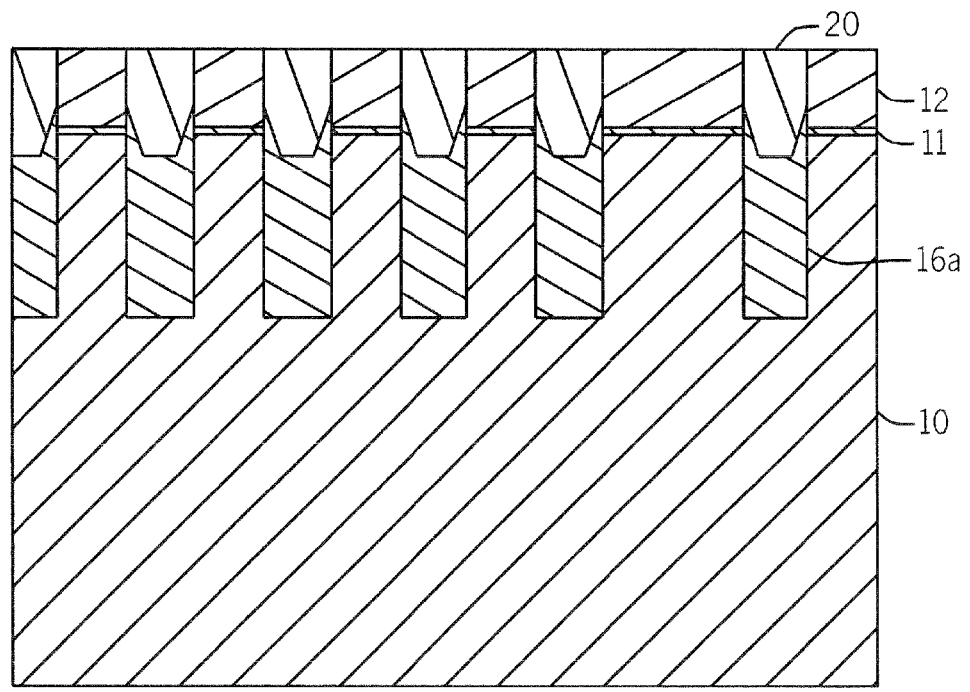
FIG. 14 is a side elevational view in the first direction at the same stage shown in FIG. 13 in accordance with one embodiment.

This etch back may be followed with filling completion by HDPCVD in one embodiment. Filling completion involves filling a trench with field oxide completely to its top. Thereafter, final planarization is undertaken, as also shown in FIGS. 13 and 14 to form planarized trench filler 20.

Thus, in some embodiments, there is only one wet anneal, only one etch back, and only one HDPCVD deposition. In the case of high etch rate processes like tetra-ethyl-ortho-silicate/ozone (TEOS/O3) thermal chemical vapor deposition (CVD), recession of those films during the post etch cleaning may be more pronounced due to the higher etch rate after anneal. The TEOS/O3 CVD may use an Applied Materials' (Santa Clara, Calif., USA) sub-atmospheric CVD (SACVD) CXZ chamber or HARP Producer.

It is possible to obtain a non-conformal deposition, depending on surface characteristics because of the deposition's surface sensitivity. Namely, the fact that deposition rate may depend on surface composition may be used to obtain differential deposition thicknesses, from one deposition process. The extent of the differential or selective deposition may be a function of the deposition recipe and thickness. Ideally, a slower deposition rate may be achieved between active pillars and a higher deposition rate may be achieved where there is larger spacing. This differential deposition rate may, for example, arise by doing the sidewall deposition by in-situ steam generation (ISSG), which is a steam process which oxidizes the active area silicon and nitride, while leaving the field oxide in the first direction unchanged.

In this way, a different surface material is exposed to the conformal deposition in each direction and, therefore, the TEOS/O3 growth rate is significantly lower than the growth rate on the larger spacing. As a result, voids may be reduced or eliminated in some embodiments.

Moreover, the filling in the second direction may be done using a thin and uniform deposition, avoiding the need for a planarization process before etch back in some embodiments.

Thus, in some embodiments, three dimensional isolation structures may be completed using less process steps, and lower total thermal budget, lower active area consumption because of only one wet anneal being performed, less nitride damage and thickness reduction because only one etch back and HDPCVD deposition is used.

In conventional processes involving two dimensional shallow trench isolations, it is conventional to fill using a conformal dielectric, followed by etch back, and then fill using HDPCVD film. This works fine in two dimensions, but, if extended into three dimensions, a number of problems arise. One of those problems that occurs in some cases is that a large number of steps may be needed to complete the same process in the first direction and then the same process in the second direction. Moreover, formation steps in the second or subsequent direction may adversely affect the structures already formed in the first direction filling. Moreover, the application of the conventional technique in both directions results in excessive exposure to chemicals and higher thermal budget, which is undesirable in most modern processes.

In some embodiments, the present invention avoids these problems by doing an oxidation before the second conformal deposition in the second direction. This changes the surface characteristics of the material in the second trench, causing the ensuing conformal dielectric to grow selectively in this area. It does not grow as much (or even at all) in the first direction field oxide already deposited because the oxidation step is ineffective against field oxide.

By delaying the etch back until after the second direction conformal deposition, damage may be reduced. Moreover, it is possible to avoid the annealing in the first direction or at least an anneal can be done as a dry, rather than a wet, anneal.

In some embodiments, the etch back can be done for both directions at the same time and, rather than using a wet etch back, a dry etch back may be used, which creates a slight positive slope of the trenches 18. This avoids exposing any active area or at least reduces the active area exposure. Active area exposure could result in active area damage or sidewall removal from critical zones, such as the active silicon corner. Because the trenches 18 are relatively shallow, the trench filling using HDPCVD is facilitated. Moreover, the positive slope of the trenches 18 facilitates filling. The HDPCVD deposition done in both directions at the same time also densifies the underlying dielectric still present on the walls to avoid any difference in etch rate of these films.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a semiconductor substrate;
   a dielectric over the substrate;
   a plurality of parallel first direction trenches in the substrate and the dielectric;
   a plurality of parallel second direction trenches perpendicular to the first direction trenches, the second direction trenches in the substrate and the dielectric;
   the first direction trenches being filled with a filler material; and
   the second direction trenches including a coating configured to encourage selective deposition in the second direction trenches.

2. The apparatus of claim 1 wherein the coating is formed in the second direction trenches, but not on the filler material in the first direction trenches.

3. The apparatus of claim 1 wherein the coating includes an oxide.

4. The apparatus of claim 1 wherein the second direction trenches are deeper than the first direction trenches.

5. The apparatus of claim 1 wherein the dielectric includes a nitride layer.

6. The apparatus of claim 1 further comprising a second filler material in the second direction trenches over the coating.

7. An apparatus comprising:
   a substrate;
   a pad over the substrate;
   a dielectric over the pad;
   a first trench extending in a first direction through the dielectric, the pad, and at least partially through the substrate;
   a second trench extending in a second direction through the dielectric, the pad, and at least partially through the substrate, wherein the second direction is perpendicular to the first direction; and
   a first filler material in the first trench and the second trench.

8. The apparatus of claim 7 further comprising a second filler material wherein the first filler material partially fills the first and second trench and the second filler material fills the first and second trenches to a top of the dielectric, wherein the second filler material is over the first filler material.

9. The apparatus of claim 8, wherein the first filler material partially fills the first and second trench and a portion of the first and second trenches filled by the second filler material comprises a wider upper end and a tapered lower end.

10. The apparatus of claim 8, wherein the second filler material is different from the first filler material.

11. The apparatus of claim 7, wherein the substrate comprises silicon, the dielectric comprises silicon nitride, and the pad comprises an oxide.

12. The apparatus of claim 7, wherein the first filler material comprises an oxide.

13. An apparatus comprising:
   a substrate;
   a pad over the substrate;
   a dielectric over the pad;
   a first plurality of trenches extending in a first direction through the dielectric, the pad, and at least partially through the substrate;
   a second plurality of trenches extending in a second direction through the dielectric, the pad, and at least partially through the substrate, wherein the second direction is perpendicular to the first direction;
   a filler material in the first and second plurality of trenches; and
   a plurality of active area pillars between the first and second plurality of trenches.

14. The apparatus of claim 13, wherein the plurality of active area pillars comprise a nitride over a pad oxide over silicon.

15. The apparatus of claim 13, wherein the plurality of active area pillars extend above the filler material.

16. The apparatus of claim 13, wherein the plurality of active area pillars are planar with the filler material.

17. The apparatus of claim 13, wherein the filler material is configured to isolate the plurality of active area pillars.

18. The apparatus of claim 17, wherein the filler material comprises an oxide.

19. The apparatus of claim 17, wherein the filler material comprises:
   a first material in contact with the substrate; and
   a second material over the first material in contact with the dielectric.

20. The apparatus of claim 13, wherein the second plurality of trenches comprises a coating under the filler material, wherein the coating is configured to encourage preferential deposition of the filler material.

* * * * *